(12) United States Patent
Tago et al.

(10) Patent No.: US 9,059,493 B2
(45) Date of Patent: Jun. 16, 2015

(54) HIGH-FREQUENCY SIGNAL LINE AND ELECTRONIC DEVICE

(71) Applicant: Murata Manufacturing Co., Ltd., Nagaokakyo-shi, Kyoto-fu (JP)

(72) Inventors: Shigeru Tago, Nagaokakyo (JP); Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/196,340

(22) Filed: Mar. 4, 2014

(65) Prior Publication Data

US 2014/0184362 A1    Jul. 3, 2014

Related U.S. Application Data

(63) Continuation of application No. PCT/JP2012/082207, filed on Dec. 12, 2012.

(30) Foreign Application Priority Data

Dec. 29, 2011    (JP) ................................. 2011-290250

(51) Int. Cl.
  *H01P 3/08*    (2006.01)
  *H05K 1/02*    (2006.01)
  *H01P 3/06*    (2006.01)

(52) U.S. Cl.
  CPC  *H01P 3/082* (2013.01); *H01P 3/08* (2013.01); *H05K 1/0253* (2013.01); *H05K 2201/09618* (2013.01); *H05K 2201/09727* (2013.01); *H01P 3/06* (2013.01); *H01P 3/085* (2013.01)

(58) Field of Classification Search
  CPC ....................................................... H01P 3/08
  USPC .................... 333/238, 246, 1, 4, 5, 204, 33
  See application file for complete search history.

(56) References Cited

U.S. PATENT DOCUMENTS 6,911,942 B2 * 6/2005 Fukuda et al. ......... 343/700 MS
2007/0046541 A1  3/2007 Pathak et al.
(Continued)

FOREIGN PATENT DOCUMENTS

| CN | 101946567 A | 1/2011 |
| EP | 2 574 155 A1 | 3/2013 |

(Continued)

OTHER PUBLICATIONS

Official Communication issued in International Patent Application No. PCT/JP2012/082207, mailed on Feb. 12, 2013.
(Continued)

*Primary Examiner* — Stephen E Jones
(74) *Attorney, Agent, or Firm* — Keating & Bennett, LLP

(57) ABSTRACT

A high-frequency signal line includes an element assembly including a plurality of flexible insulator layers. a linear signal line provided in or on the element assembly, a first ground conductor provided in or on the element assembly and extending along the signal line, a plurality of second ground conductors provided in or on the element assembly and arranged at predetermined intervals in a direction in which the signal line extends, on a first side in a direction of lamination relative to the signal line, the second ground conductors being opposite to the signal line with at least one of the insulator layers positioned therebetween, and a plurality of first via-hole conductors extending through at least one of the insulator layers so as to connect the first and second ground conductors.

16 Claims, 17 Drawing Sheets

(56) References Cited

U.S. PATENT DOCUMENTS

| | | |
|---|---|---|
| 2010/0225425 A1* | 9/2010 | Cho .............................. 333/238 |
| 2010/0314159 A1 | 12/2010 | Lee et al. |
| 2012/0133458 A1 | 5/2012 | Kato et al. |
| 2014/0048312 A1 | 2/2014 | Kato et al. |

FOREIGN PATENT DOCUMENTS

| | | |
|---|---|---|
| EP | 2 590 485 A1 | 5/2013 |
| JP | 2007-123740 A | 5/2007 |
| JP | 2011-071403 A | 4/2011 |
| WO | 2011/007660 A1 | 1/2011 |
| WO | 2011/018934 A1 | 2/2011 |

OTHER PUBLICATIONS

Official Communication issued in corresponding UK Patent Application No. GB 1401211.6, mailed on May 2, 2014.

Official Communication issued in corresponding Chinese Patent Application No. 201280038422.7, mailed on Sep. 15, 2014.

Official Communication issued in corresponding UK Patent Application No. GB 1401211.6, mailed on Sep. 2, 2014.

* cited by examiner

F I G. 6A
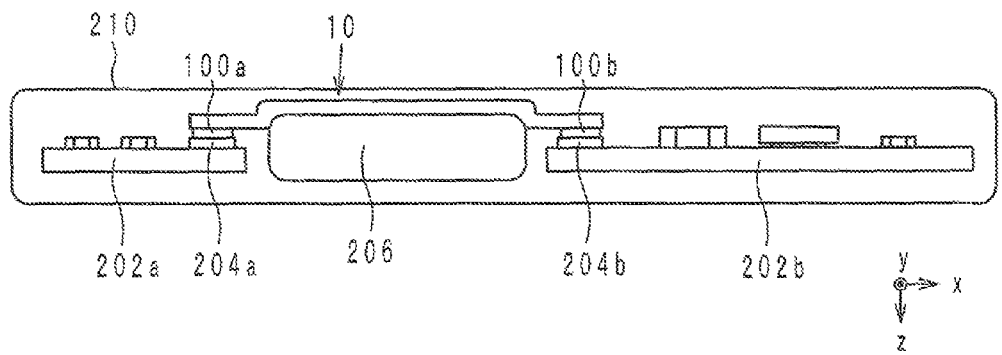
F I G. 6B
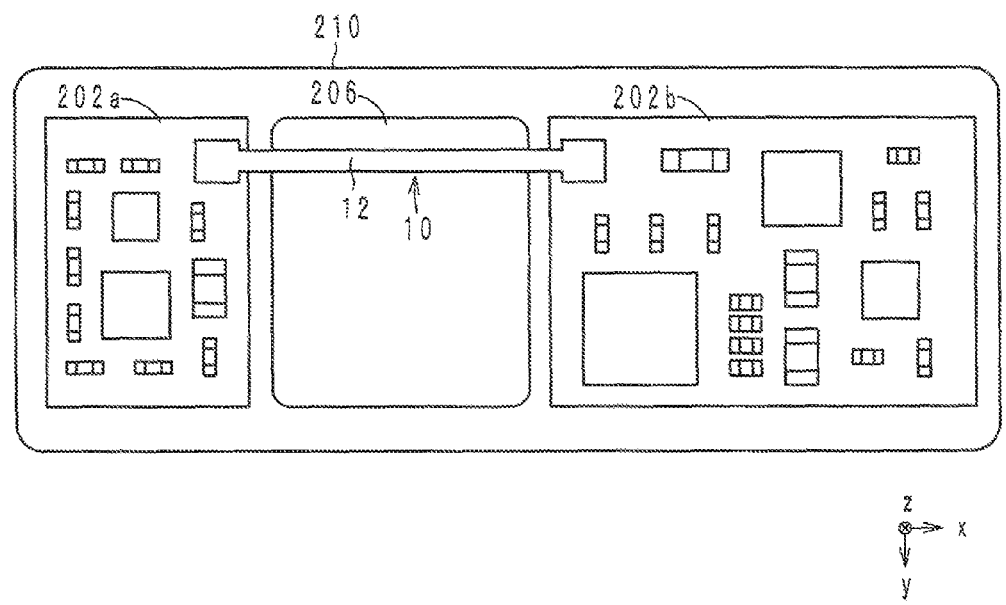

HIGH-FREQUENCY SIGNAL LINE AND ELECTRONIC DEVICE

This application is based on International Application No. PCT/JP 2012/082207 filed on Dec. 12, 2012, and Japanese Patent Application No. 2011-290250 filed on Dec. 29, 2011, the entire content of each of which is incorporated herein by reference.

BACKGROUND OF THE INVENTION

1. Field of the Invention

The present invention relates to high-frequency signal lines, more particularly to a high-frequency signal line including a signal line provided on a flexible element assembly, and an electronic device including the high-frequency signal line.

2. Description of Related Art

As a conventional high-frequency signal line, a flexible board disclosed in, for example, Japanese Patent Laid-Open Publication No. 2007-123740 is known. FIG. 17 illustrates the flexible board 600 disclosed in Japanese Patent Laid-Open Publication No. 2007-123740, as viewed in a plan view in the direction of lamination.

The flexible board 600 includes a signal line 602 and a ground layer 604. The signal line 602 is a linear conductor. The ground layer 604 is laminated on a dielectric layer provided above the signal line 602 in the direction of lamination. Moreover, although not shown, another ground layer is provided below the signal line 602 in the direction of lamination. In addition, the flexible board 600 has a plurality of openings 606 provided in the ground layer 604. The openings 606 are in the form of rectangles aligned above the signal line 602 in the direction in which the signal line 602 extends. By providing the openings 606 in such a manner, the flexible board 600 can be formed thinner.

However, in the flexible board 600 disclosed in Japanese Patent Laid-Open Publication No. 2007-123740, the signal line 602 is positioned between the ground layer 604 and the unillustrated ground layer. The ground layer 604 and the unillustrated ground layer are made of copper foil, which is resistant to deformation, and therefore, the high-frequency signal line is inhibited from being bent.

SUMMARY OF THE INVENTION

A high-frequency signal line according to a preferred embodiment of the present invention includes an element assembly including a plurality of flexible insulator layers, a linear signal line provided in or on the element assembly; a first ground conductor provided in or on the element assembly and extending along the signal line; a plurality of second ground conductors provided in or on the element assembly and arranged at predetermined intervals in a direction in which the signal line extends, on a first side in a direction of lamination relative to the signal line, the second ground conductors being opposite to the signal line with at least one of the insulator layers positioned therebetween, and a plurality of first via-hole conductors extending through at least one of the insulator layers so as to connect the first and second ground conductors.

An electronic device according to another preferred embodiment of the present invention includes a housing and a high-frequency signal line accommodated in the housing. The high-frequency signal line includes an element assembly including a plurality of flexible insulator layers, a linear signal line provided in or on the element assembly, a first ground conductor provided in or on the element assembly and extending along the signal line, a plurality of second ground conductors provided in or on the element assembly and arranged at predetermined intervals in a direction in which the signal line extends, on a first side in a direction of lamination relative to the signal line, the second ground conductors being opposite to the signal line with at least one of the insulator layers positioned therebetween, and a plurality of first via-hole conductors extending through at least one of the insulator layers so as to connect the first and second ground conductors.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A and 6B illustrate an electronic device provided with a high-frequency signal line as viewed in plan views in y-axis and z-axis directions, respectively.

DETAILED DESCRIPTION OF THE PREFERRED EMBODIMENTS

Hereinafter, a high-frequency signal line according to preferred embodiments of the present invention, along with an electronic device including the signal line, will be described with reference to the drawings.

Figure 1:
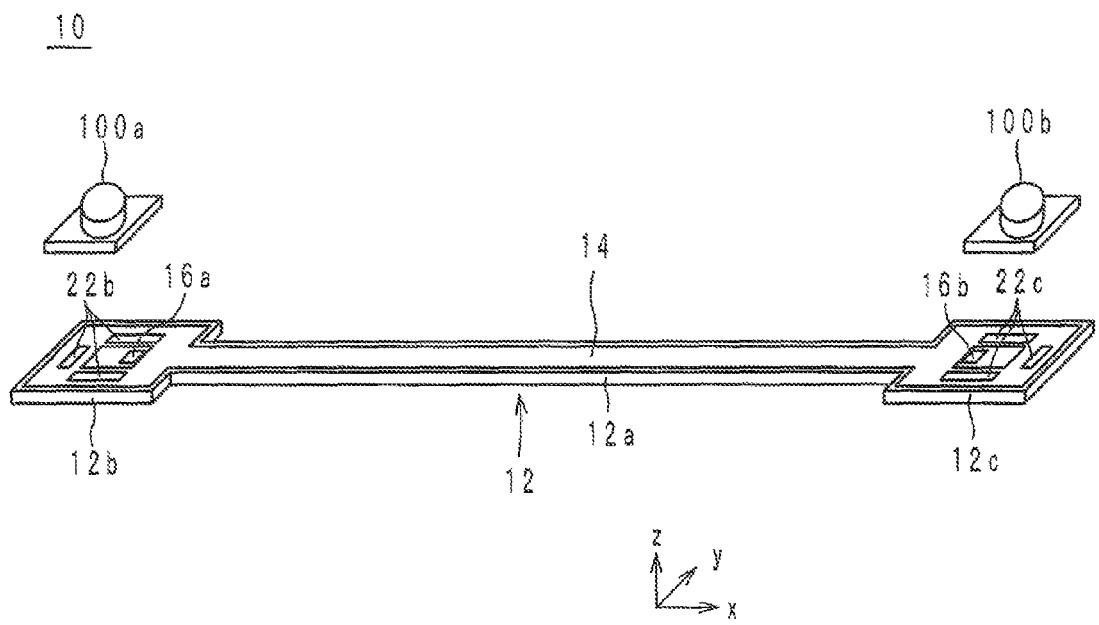
FIG. 1 is an external oblique view of a high-frequency signal line according to a preferred embodiment of the present invention.
Figure 2:
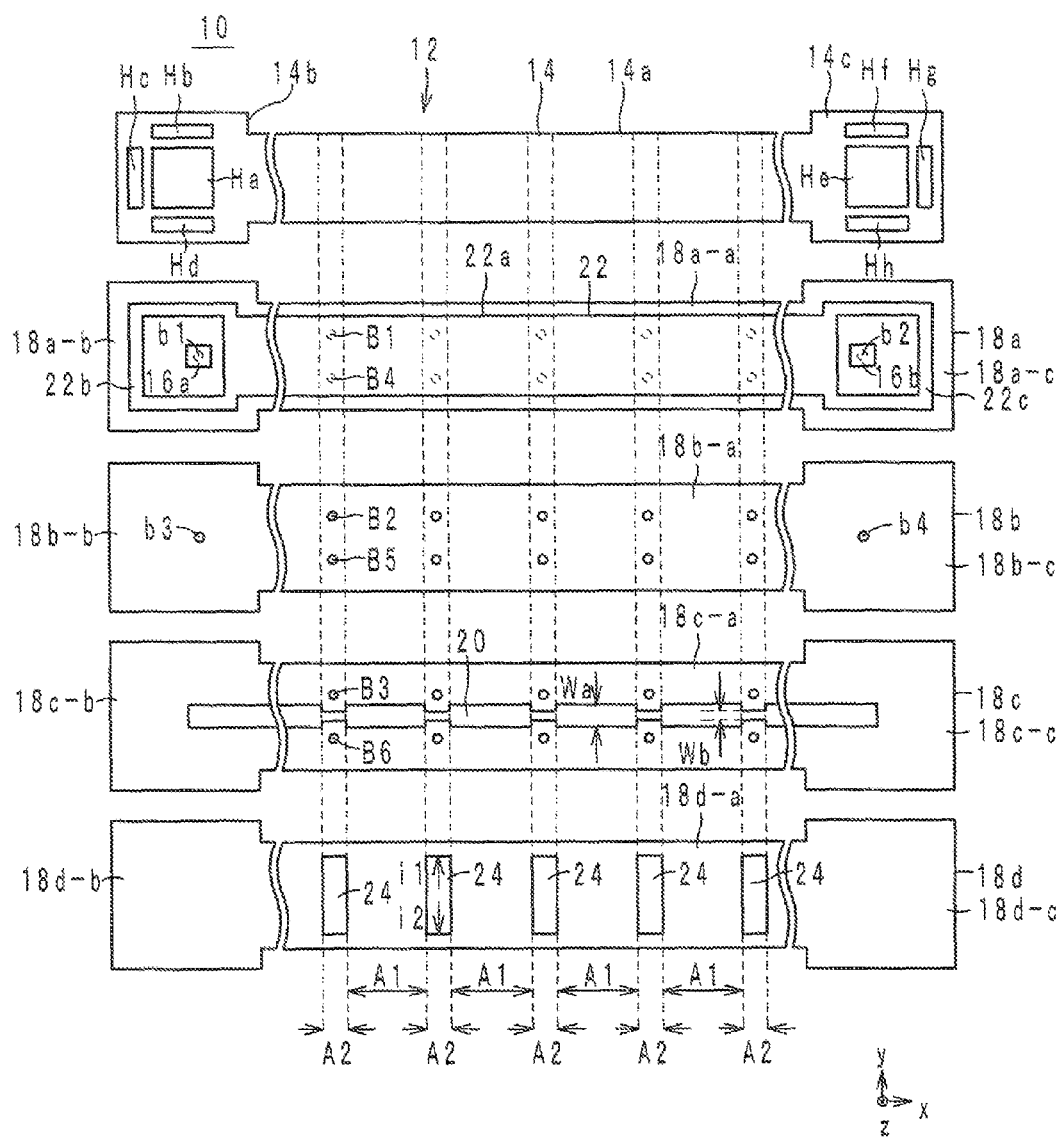
FIG. 2 is an exploded view of a dielectric element assembly of the high-frequency signal line in FIG. 1.
Figure 3:
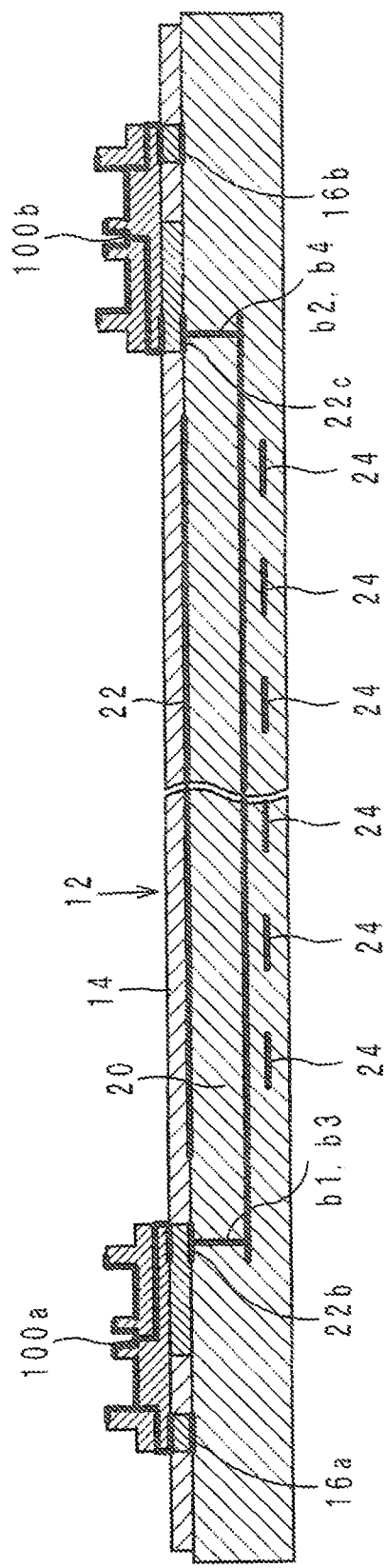
FIG. 3 is a cross-sectional structure view of the high-frequency signal line in FIG. 1.
Figure 4:
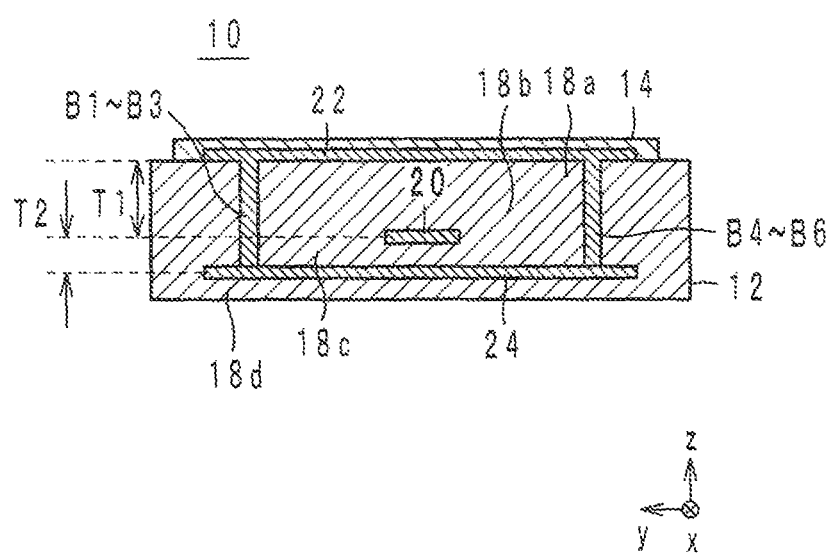
FIG. 4 is another cross-sectional structure view of the high-frequency signal line.
Figure 5A:
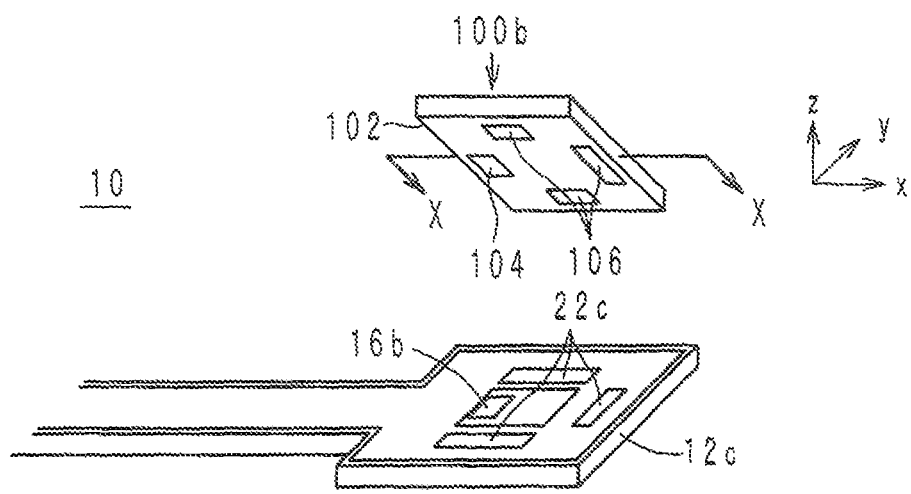
FIG. 5A is an external oblique view of a connector of the high-frequency signal line.
Figure 5B:
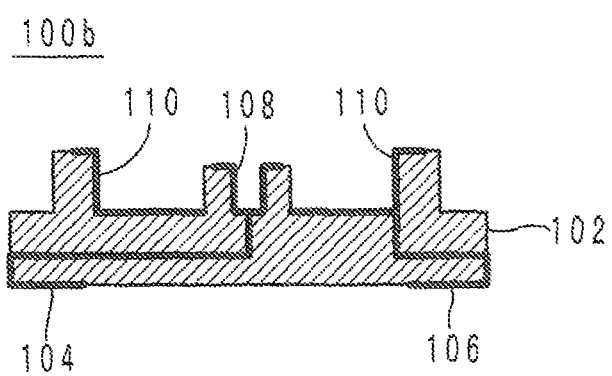
FIG. 5B is a cross-sectional structure view of the connector of the high-frequency signal line.

The configuration of the high-frequency signal line according to a preferred embodiment of the present invention will be described below with reference to the drawings. FIG. 1 is an external oblique view of the high-frequency signal line 10 according to a preferred embodiment of the present invention. FIG. 2 is an exploded view of a dielectric element assembly 12 of the high-frequency signal line 10 in FIG. 1. FIG. 3 is a cross-sectional structure view of the high-frequency signal line 10 in FIG. 1. FIG. 4 is another cross-sectional structure view of the high-frequency signal line 10. FIG. 5A is an external oblique view of a connector 100b of the high-frequency signal line 10. FIG. 5B is a cross-sectional structure view of the connector 100b. In FIGS. 1 through 5B, the direction of lamination of the high-frequency signal line 10 will be defined as a z-axis direction. Moreover, the longitudinal direction of the high-frequency signal line 10 will be defined as an x-axis direction, and the direction perpendicular to the x-axis and z-axis directions will be defined as a y-axis direction.

The high-frequency signal line 10 is preferably used in, for example, an electronic device such as a cell phone, to connect two high-frequency circuits. The high-frequency signal line 10 includes the dielectric element assembly 12, external terminals 16 (16a and 16b), a signal line 20, ground conductors 22 and 24, via-hole conductors b1 to b4 and B1 to B6, a connector 100a, and the connector 100b, as shown in FIGS. 1 through 3.

The dielectric element assembly 12, when viewed in a plan view in the z-axis direction, extends in the x-axis direction, and includes a line portion 12a and connecting portions 12b and 12c. The dielectric element assembly 12 is a laminate formed preferably by laminating a protective layer 14 and dielectric sheets (insulator layers) 18 (18a to 18d) in this order, from the positive side to the negative side in the z-axis direction, as shown in FIG. 2. In the following, the principal surface of the dielectric element assembly 12 that is located on the positive side in the z-axis direction will be referred to as a front surface (first principal surface), and the principal surface of the dielectric element assembly 12 that is located on the negative side in the z-axis direction will be referred to as a bottom surface (second principal surface).

The line portion 12a extends in the x-axis direction. The connecting portion 12b has a rectangular or substantially rectangular shape connected to the end of the line portion 12a on the negative side in the x-axis direction, and the connecting portion 12c has a rectangular or substantially rectangular shape connected to the end of the line portion 12a on the positive side in the x-axis direction. The width of each of the connecting portions 12b and 12c in the y-axis direction is greater than the width of the line portion 12a in the y-axis direction.

The dielectric sheets 18, when viewed in a plan view in the z-axis direction, extend in the x-axis direction, and have the same shape as the dielectric element assembly 12. The dielectric sheets 18 are made of a flexible thermoplastic resin such as polyimide or liquid crystal polymer. The total thickness T1 of the dielectric sheets 18a and 18b is greater than the thickness T2 of the dielectric sheet 18c, as shown in FIG. 4. For example, the thickness T1 preferably is about 50 μm to about 300 μm after lamination of the dielectric sheets 18a to 18d. In the present preferred embodiment, the thickness T1 preferably is about 150 μm, for example. Moreover, the thickness T2 preferably is about 10 μm to about 100 μm, for example. In the present preferred embodiment, the thickness T2 preferably is about 50 μm, for example. In the following, the principal surface of each of the dielectric sheets 18 that is located on the positive side in the z-axis direction will be referred to as a top surface, and the principal surface of each of the dielectric sheets 18 that is located on the negative side in the z-axis direction will be referred to as a bottom surface.

Furthermore, the dielectric sheet 18a includes a line portion 18a-a and connecting portions 18a-b and 18a-c. The dielectric sheet 18b includes a line portion 18b-a and connecting portions 18b-b and 18b-c. The dielectric sheet 18c includes a line portion 18c-a and connecting portions 18c-b and 18c-c. The dielectric sheet 18d includes a line portion 18d-a and connecting portions 18d-b and 18d-c. The line portions 18a-a, 18b-a, 18c-a, and 18d-a define the line portion 12a. The connecting portions 18a-b, 18b-b, 18c-b, and 18d-b define the connecting portion 12b. The connecting portions 18a-c, 18b-c, 18c-c, and 18d-c define the connecting portion 12c.

The external terminal 16a is a rectangular or substantially rectangular conductor provided near the center of the top surface of the connecting portion 18a-b, as shown in FIGS. 1 and 2. The external terminal 16b is a rectangular or substantially rectangular conductor provided near the center of the top surface of the connecting portion 18a-c, as shown in FIGS. 1 and 2. The external terminals 16a and 16b are made of a metal material mainly composed of silver or copper and having a low specific resistance. In addition, the top surfaces of the external terminals 16a and 16b preferably are plated with gold.

The signal line 20 is a linear conductor provided in the dielectric element assembly 12 and extending on the top surface of the dielectric sheet 18b in the x-axis direction, as shown in FIG. 2. The signal line 20, when viewed in a plan view in the z-axis direction, overlaps with the external terminals 16a and 16b at opposite ends. The signal line 20 is made of a metal material mainly composed of silver or copper and having a low specific resistance.

The ground conductor 22 (first ground conductor) is provided in the dielectric element assembly 12 on the positive side in the z-axis direction relative to the signal line 20, as shown in FIG. 2, and more specifically, the ground conductor 22 is provided on the top surface of the dielectric sheet 18a, which is closest to the top surface of the dielectric element assembly 12. The ground conductor 22 extends in the x-axis direction along the signal line 20 on the top surface of the dielectric sheet 18a, and is opposed to the signal line 20 with the dielectric sheets 18a and 18b positioned therebetween. The ground conductor 22 is essentially not provided with openings. That is, the ground conductor 22 is a so-called solid electrode, which extends continuously in the x-axis direction along the signal line 20 in the line portion 12a. Note that the ground conductor 22 does not have to cover the line portion 12a completely, and, for example, it may have microscopic holes provided at predetermined positions such that gases generated by thermocompression bonding of the thermoplastic resin in the dielectric sheets 18 are allowed to escape therefrom. The ground conductor 22 is made of a metal material mainly composed of silver or copper and having a low specific resistance.

Furthermore, the ground conductor 22 includes a line portion 22a and terminal portions 22b and 22c. The line portion 22a is provided on the top surface of the line portion 18a-a, and extends in the x-axis direction. The terminal portion 22b is provided on the top surface of the connecting portion 18a-b, in the form of a rectangular or substantially rectangular rim around the external terminal 16a. The terminal portion 22b is connected to the end of the line portion 22a on the negative side in the x-axis direction. The terminal portion 22c is provided on the top surface of the connecting portion 18a-c, in the form of a rectangular or substantially rectangular rim around the external terminal 16b. The terminal portion 22c is connected to the end of the line portion 22a on the positive side in the x-axis direction.

Here, the characteristic impedance of the high-frequency signal line 10 is determined mainly by the opposed areas of the signal line 20 and the ground conductor 22 and the distance therebetween, as well as by the relative permittivities of the dielectric sheets 18a to 18d. Therefore, in the case where the characteristic impedance of the high-frequency signal line 10 is to be set to 50Ω, for example, the characteristic impedance of the high-frequency signal line 10 is designed to become 55Ω, for example, slightly higher than the 50Ω, because of the influence of the signal line 20 and the reference ground conductor 22. Moreover, the ground conductors 24 to be described later are shaped such that the characteristic impedance of the high-frequency signal line 10 preferably becomes about 50Ω, for example, because of the influence of the signal line 20 and the ground conductors 22 and 24. In this manner, the ground conductor 22 serves as a reference ground conductor.

The ground conductors 24 (second ground conductors) are provided in the dielectric element assembly 12 on the negative side in the z-axis direction relative to the signal line 20, as shown in FIG. 2, and more specifically, the ground conductors 24 are provided on the top surface of the dielectric sheet 18d. Accordingly, the ground conductors 24 are positioned between the dielectric sheets 18c and 18d, as shown in FIG. 2. The ground conductors 24 are preferably rectangular or substantially rectangular extending in the y-axis direction, and, when viewed in a plan view in the z-axis direction, they cross the signal line 20. Moreover, the ground conductors 24 are aligned at predetermined intervals (in the present preferred embodiment, at equal intervals) in the x-axis direction along the signal line 20 on the top surface of the dielectric sheet 18d. The interval between the ground conductors 24 is preferably less than or equal to half the wavelength of a high-frequency signal to be transmitted through the signal line 20. In addition, the ground conductors 24 are opposed to the signal line 20 with the dielectric sheet 18c positioned therebetween. Accordingly, the ground conductors 24 are opposed to the ground conductor 22 as well, with the signal line 20 positioned therebetween. Moreover, the ground conductors 24 are made of a metal material mainly composed of silver or copper and having a low specific resistance.

Here, as shown in FIG. 2, areas of the high-frequency signal line 10 where the signal line 20 does not overlap with the ground conductors 24 will be referred to as areas A1, and areas of the high-frequency signal line 10 where the signal line 20 overlaps with the ground conductors 24 will be referred to as areas A2. The areas A1 and A2 alternate with each other in the x-axis direction. Moreover, the width Wa of the signal line 20 in the areas A1 is greater than the width Wb of the signal line 20 in the areas A2, as shown in FIG. 2. In the areas A1, the signal line 20 does not overlap with any ground conductors 24, and therefore, the width Wa is increased so as to reduce the high-frequency resistance value of the signal line. On the other hand, in the areas A2, the signal line 20 overlaps with the ground conductors 24, and therefore, the width Wb is preferably set narrower than the width Wa in the areas A1 in order to inhibit the high-frequency resistance value from being reduced.

The ground conductors 24 are auxiliary ground conductors that double as shields. Moreover, the ground conductors 24 are preferably designed to make final adjustments such that the characteristic impedance of the high-frequency signal line 10 is set to about 50Ω, for example, as described above.

The via-hole conductor b1 extends through the connecting portion 18a-b of the dielectric sheet 18a in the z-axis direction. The via-hole conductor b3 extends through the connecting portion 18b-b of the dielectric sheet 18b in the z-axis direction. The via-hole conductors b1 and b3 are connected to each other to define a single via-hole conductor that connects the external terminal 16a and the end of the signal line 20 that is located on the negative side in the x-axis direction.

The via-hole conductor b2 extends through the connecting portion 18a-c of the dielectric sheet 18a in the z-axis direction. The via-hole conductor b4 extends through the connecting portion 18b-c of the dielectric sheet 18b in the z-axis direction. The via-hole conductors b2 and b4 are connected to each other to constitute a single via-hole conductor that connects the external terminal 16b and the end of the signal line 20 that is located on the positive side in the x-axis direction. As a result, the signal line 20 is connected between the external terminals 16a and 16b. The via-hole conductors b1 to b4 are made of a metal material mainly composed of silver or copper and having a low specific resistance.

The via-hole conductors B1 to B3 extend through the line portions 18a-a, 18b-a, and 18c-a of the dielectric sheets 18a, 18b, and 18c, respectively, in the z-axis direction, such that the via-hole conductors B1 are aligned at equal intervals in the line portion 18a-a, the via-hole conductors B2 are aligned at equal intervals in the line portion 18b-a, and the via-hole conductors B3 are aligned at equal intervals in the line portion 18c-a. The via-hole conductors B1 to B3, when viewed in a plan view in the z-axis direction, are positioned on the positive side in the y-axis direction relative to the signal line 20 (i.e., on one side in a direction perpendicular to the direction in which the signal line 20 extends). Moreover, the via-hole conductors B1 to B3 are connected to one another, so that each combination constitutes a single via-hole conductor that connects the ground conductor 22 and the end of the ground conductor 24 that is located on the positive side in the y-axis direction. The via-hole conductors B1 to B3 are made of a metal material mainly composed of silver or copper and having a low specific resistance.

The via-hole conductors B4 to B6 extend through the line portions 18a-a, 18b-a, and 18c-a of the dielectric sheets 18a, 18b, and 18c, respectively, in the z-axis direction, such that the via-hole conductors B4 are aligned at equal intervals in the line portion 18a-a, the via-hole conductors B5 are aligned at equal intervals in the line portion 18b-a, and the via-hole conductors B6 are aligned at equal intervals in the line portion 18c-a. The via-hole conductors B4 to B6, when viewed in a plan view in the z-axis direction, are positioned on the negative side in the y-axis direction relative to the signal line 20 (i.e., on the opposite side in the direction perpendicular to the direction in which the signal line 20 extends). Moreover, the via-hole conductors B4 to B6 are connected to one another, so that each combination constitutes a single via-hole conductor that connects the ground conductor 22 and the end of the ground conductor 24 that is located on the negative side in the y-axis direction. The via-hole conductors B4 to B6 are made of a metal material mainly composed of silver or copper and having a low specific resistance.

In this manner, the signal line 20 is surrounded by the via-hole conductors B1 to B6 and the ground conductors 22 and 24, as shown in FIG. 4. In addition, a tri-plate stripline structure includes the signal line 20 being positioned between the ground conductors 22 and 24, which are located on opposite sides in the z-axis direction. Moreover, the distance between the signal line 20 and the ground conductor 22 preferably is, for example, about 50 μm to about 300 μm, which is approximately equal to the total thickness T1 of dielectric sheets 18a and 18b, as shown in FIG. 4. In the present preferred embodiment, the distance between the signal line 20 and the ground conductor 22 preferably is about 150 μm, for example. On the other hand, the distance between the signal line 20 and the ground conductor 24 preferably is, for example, about 10 μm to about 100 μm, for example, which is approximately equal to the thickness T2 of the dielectric sheet 18c, as shown in FIG. 4. In the present preferred embodiment, the distance between the signal line 20 and the ground conductor 24 preferably is about 50 μm, for example. That is, the thickness T1 is designed to be greater than the thickness T2.

The protective layer 14 covers approximately the entire top surface of the dielectric sheet 18a. Accordingly, the ground conductor 22 is covered by the protective layer 14. The protective layer 14 is made of, for example, a flexible resin such as a resist material.

Furthermore, the protective layer 14 includes a line portion 14a and connecting portions 14b and 14c, as shown in FIG. 2. The line portion 14a covers the entire top surface of the line portion 18a-a, including the line portion 22a provided thereon.

The connecting portion 14b is connected to the end of the line portion 14a on the negative side in the x-axis direction, so as to cover the top surface of the connecting portion 18a-b. The connecting portion 14b includes openings Ha to Hd provided therein. The opening Ha is a rectangular or substantially rectangular opening positioned approximately at the center of the connecting portion 14b. The external terminal 16a is exposed to the outside from the opening Ha. The opening Hb is a rectangular or substantially rectangular opening provided on the positive side in the y-axis direction relative to the opening Ha. The opening Hc is a rectangular or substantially rectangular opening provided on the negative side in the x-axis direction relative to the opening Ha. The opening Hd is a rectangular or substantially rectangular opening provided on the negative side in the y-axis direction relative to the opening Ha. The terminal portion 22b is exposed to the outside from the openings Hb to Hd, so that the exposed portions serve as external terminals.

The connecting portion 14c is connected to the end of the line portion 14a on the positive side in the x-axis direction, so as to cover the top surface of the connecting portion 18a-c. The connecting portion 14c includes openings He to Hh provided therein. The opening He is a rectangular or substantially rectangular opening positioned approximately at the center of the connecting portion 14c. The external terminal 16b is exposed to the outside from the opening He. The opening Hf is a rectangular or substantially rectangular opening provided on the positive side in the y-axis direction relative to the opening He. The opening Hg is a rectangular or substantially rectangular opening provided on the positive side in the x-axis direction relative to the opening He. The opening Hh is a rectangular or substantially rectangular opening provided on the negative side in the y-axis direction relative to the opening He. The terminal portion 22c is exposed to the outside from the openings Hf to Hh, so that the exposed portions serve as external terminals.

The connectors 100a and 100b are mounted on the top surfaces of the connecting portions 12b and 12c, respectively. The connectors 100a and 100b are preferably configured in the same manner, and therefore, only the configuration of the connector 100b will be described below by way of example.

The connector 100b includes a connector body 102, external terminals 104 and 106, a center conductor 108, and an external conductor 110, as shown in FIGS. 1, 5A, and 5B. The connector body 102 includes a rectangular or substantially rectangular plate and a cylindrical portion coupled thereon, and is made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the portions of the terminal portion 22c that are exposed from the openings Hf to Hh.

The center conductor 108 is positioned at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b thus configured is mounted on the top surface of the connecting portion 12c, such that the external terminal 104 is connected to the external terminal 16b, and the external terminal 106 is connected to the terminal portion 22c. As a result, the signal line 20 is electrically connected to the center conductor 108. In addition, the ground conductors 22 and 24 are electrically connected to the external conductor 110.

The high-frequency signal line 10 is used in a manner as will be described below. FIGS. 6A and 6B illustrate the electronic device 200 provided with the high-frequency signal line 10 as viewed in plan views in the y-axis and z-axis directions, respectively.

The electronic device 200 includes the high-frequency signal line 10, circuit boards 202a and 202b, receptacles 204a and 204b, a battery pack (metallic body) 206, and a housing 210.

The housing 210 accommodates the circuit boards 202a and 202b, the receptacles 204a and 204b, and the battery pack 206. For example, the circuit board 202a has provided thereon a transmission or reception circuit including an antenna. The circuit board 202b has, for example, a power circuit provided thereon. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the high-frequency signal line 10 connects the circuit boards 202a and 202b.

Here, the top surface of the dielectric element assembly 12 (more specifically, the protective layer 14) is in contact with the battery pack 206. In addition, the top surface of the dielectric element assembly 12 is fixed to the battery pack 206 by an adhesive or suchlike. The top surface of the dielectric element assembly 12 is a principal surface positioned beyond the ground conductor 22 when viewed from the position of the signal line 20. That is, the ground conductor 22, which is in solid form, is positioned between the signal line 20 and the battery pack 206.

A non-limiting example of a method for producing the high-frequency signal line 10 will be described below with reference to FIG. 2. While the following description focuses on one high-frequency signal line 10 as an example, in actuality, large-sized dielectric sheets are laminated and cut, so that a plurality of high-frequency signal lines 10 are produced at the same time.

Prepared first are dielectric sheets 18 made of a thermoplastic resin and having their entire top surfaces copper-foiled. The copper-foiled top surfaces of the dielectric sheets 18 are smoothened, for example, by galvanization for rust prevention. The thickness of the copper foil preferably is about 10 μm to about 20 μm, for example.

Next, external terminals 16 and a ground conductor 22, as shown in FIG. 2, are formed on the top surface of the dielectric sheet 18a by photolithography. Specifically, resists are printed on the copper foil of the dielectric sheet 18a in the same patterns as the external terminals 16 (16a and 16b) and the ground conductor 22 shown in FIG. 2. Then, any portions of the copper foil that are not coated with the resists are removed by etching. Thereafter, the resists are removed. As a result, the external terminals 16 and the ground conductor 22 are formed on the top surface of the dielectric sheet 18a, as shown in FIG. 2.

Next, a signal line 20, as shown in FIG. 2, is formed on the top surface of the dielectric sheet 18c by photolithography. In addition, ground conductors 24, as shown in FIG. 2, are formed on the top surface of the dielectric sheet 18d by photolithography. Note that the above photolithographic steps are the same as the photolithographic steps for forming the external terminals 16 and the ground conductor 22, and therefore, any descriptions thereof will be omitted.

Next, via-holes are bored through the dielectric sheets 18a to 18c by irradiating their bottom surfaces with laser beams where via-hole conductors b1 to b4 and B1 to B6 are to be formed. Thereafter, the via-holes provided in the dielectric sheets 18a to 18c are filled with a conductive paste.

Next, the dielectric sheets 18a to 18d are stacked in this order, from the positive side to the negative side in the z-axis direction. Then, the dielectric sheets 18a to 18d are heated and pressed from the positive side toward the negative side in the z-axis direction, thus softening the dielectric sheets 18a to 18d so as to be bonded and integrated, while solidifying the conductive paste in the via-holes, so that the via-hole conductors b1 to b4 and B1 to B6 are formed, as shown in FIG. 2. Note that the dielectric sheets 18 may be integrated using an adhesive, such as epoxy resin, rather than by thermocompression bonding. In addition, after the dielectric sheets 18 are integrated, the via-hole conductors b1 to b4 and B1 to B6 may be formed by providing via-holes in the dielectric sheets 18 and filling the via-holes with a conductive paste or forming a plated coating over the via-holes. Note that the via-hole conductors b1 to b4 and B1 to B6 may be formed so as to, for example, simply cover the inner circumferential surfaces of the via-holes, rather than to fill the via-holes completely.

Lastly, a resin (resist) paste is applied to the dielectric sheet 18a, thus forming a protective layer 14 thereon. As a result, the high-frequency signal line 10 shown in FIG. 1 is obtained.

The high-frequency signal line 10 thus configured can be bent in use. More specifically, in the case of the flexible board 600 disclosed in Japanese Patent Laid-Open Publication No. 2007-123740, the signal line 602 is positioned between the ground layer 604 and the unillustrated ground layer. The ground layer 604 and the unillustrated ground layer are made of copper foil, which is resistant to deformation, and therefore, inhibit the high-frequency signal line from being bent.

On the other hand, in the case of the high-frequency signal line 10, the ground conductors 24 are arranged along the signal line 20 on the negative side in the z-axis direction relative to the signal line 20. In addition, the ground conductors are not connected to one another. Accordingly, the high-frequency signal line 10 includes the areas A1 where the ground conductors 24 are not provided. Therefore, the high-frequency signal line 10 can be bent readily in the areas A1.

Furthermore, the high-frequency signal line 10 can be readily bent also for the reasons given below. The characteristic impedance Z of the high-frequency signal line 10 is represented by $\sqrt{(L/C)}$, where L is an inductance value per unit length of the high-frequency signal line 10, and C is a capacitance value per unit length of the high-frequency signal line 10. The high-frequency signal line 10 is designed such that Z takes a predetermined characteristic impedance value (e.g., about 50Ω).

Here, to allow the high-frequency signal line 10 to be readily bendable, it is conceivable to reduce the thickness of the high-frequency signal line 10 in the z-axis direction (simply referred to below as the thickness of the high-frequency signal line 10). However, reducing the thickness of the high-frequency signal line 10 results in a shorter distance between the signal line 20 and each of the ground conductors 22 and 24, hence an increased capacitance value C. As a result, the characteristic impedance Z becomes less than the predetermined characteristic impedance value.

Therefore, the signal line 20 is conceivably narrowed to increase the inductance value L of the signal line 20 and reduce the opposed areas of the signal line 20 and the ground conductors 22 and 24, thus reducing the capacitance value C.

However, narrowing the signal line 20 increases the direct-current resistance of the signal line 20, resulting in an increased high-frequency loss. The high-frequency loss refers to a loss caused by a high-frequency signal being converted into heat in an impedance-matching situation.

Therefore, the high-frequency signal line 10 has the areas A1 where the signal line 20 does not overlap with the ground conductors 24. As a result, the opposed areas of the signal line 20 and the ground conductors 24 are reduced, resulting in a smaller capacitance value C. Accordingly, there is no need to increase the distance between the signal line 20 and the ground conductors 24. Thus, it is possible to render the high-frequency signal line readily bendable while maintaining the characteristic impedance Z at the predetermined characteristic impedance value.

Figure 7:
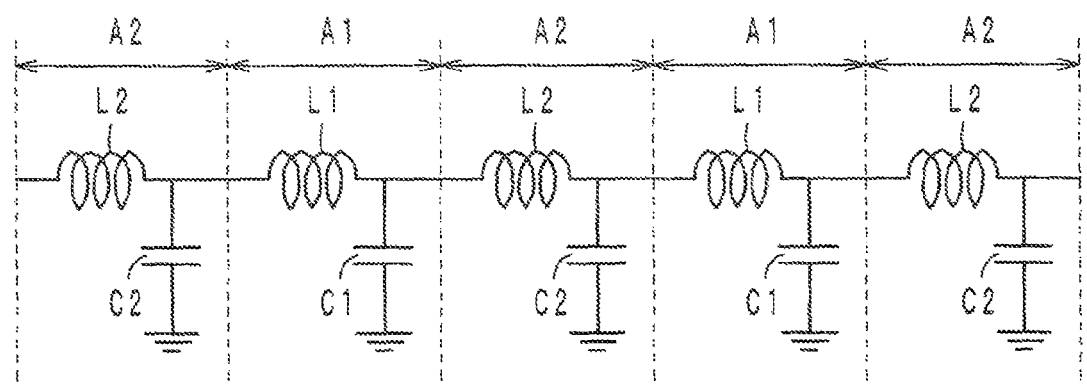
FIG. 7 is an equivalent circuit diagram of the high-frequency signal line.

Furthermore, in the case of the high-frequency signal line 10, the characteristic impedance of the signal line 20 is inhibited from deviating from a predetermined characteristic impedance value (e.g., about 50Ω). FIG. 7 is an equivalent circuit diagram of the high-frequency signal line 10.

In the areas A1, the signal line 20 includes inductance components L1, as shown in FIG. 7. Moreover, in the areas A1, the signal line 20 includes capacitance components C1 since it is opposed to the ground conductor 22. Accordingly, in each of the areas A1, a circuit is defined by the inductance component L1 connected at one end to the capacitance component C1, which is grounded at the other end.

On the other hand, in the areas A2, the signal line 20 includes inductance components L2, as shown in FIG. 7. Moreover, in the areas A2, the signal line 20 includes capacitance components C2 since it is opposed to the ground conductors 22 and 24. Accordingly, in each of the areas A2, a circuit is defined by the inductance component L2 connected at one end to the capacitance component C2, which is grounded at the other end. The areas A1 and A2 are connected in a series so as to alternate with each other.

Here, the ground conductors 24 are not provided in the areas A1, and therefore, the value of the capacitance components C1 in the areas A1 is less than that of the capacitance components C2 in the areas A2. Accordingly, the characteristic impedance of the signal line 20 is higher in the areas A1 than in the areas A2. Therefore, the width Wa of the signal line 20 in the areas A1 is greater than the width Wb of the signal line 20 in the areas A2. Correspondingly, the value of the inductance components L1 is less than that of the inductance components L2. As a result, the characteristic impedance of the signal line 20 in the areas A1 approximates to the characteristic impedance of the signal line 20 in the areas A2. Thus, the characteristic impedance of the signal line 20 is inhibited from varying and thus deviating from the predetermined characteristic impedance value. Note that since the signal line 20 does not overlap with the ground conductors 24 in the areas A1, the high-frequency resistance value of the signal line 20 can be reduced by increasing the width Wa.

Furthermore, the high-frequency signal line 10 allows the characteristic impedance of the signal line 20 to be inhibited from deviating from a predetermined characteristic impedance value (e.g., about 50Ω). More specifically, in the high-frequency signal line 10, the top surface of the dielectric element assembly 12, which is positioned beyond the ground conductor 22 when viewed from the position of the signal line 20, is in contact with the battery pack 206. That is, the ground conductor 22, which essentially does not have any openings provided therein, is positioned between the signal line 20 and the battery pack 206. Accordingly, electromagnetic coupling is inhibited from occurring between the signal line 20 and the battery pack 206. As a result, in the high-frequency signal line 10, the characteristic impedance of the signal line 20 is inhibited from deviating from the predetermined characteristic impedance value.

Furthermore, in the high-frequency signal line 10, the ground conductor 22 is positioned on the positive side in the z-axis direction relative to the signal line 20, and the ground conductors 24 are positioned on the negative side in the z-axis direction relative to the signal line 20. Moreover, the via-hole conductors B1 to B6 are positioned on opposite sides of the signal line 20 in the y-axis direction. Thus, the high-frequency signal line 10 is inhibited from emitting spurious radiation.

Figure 8:
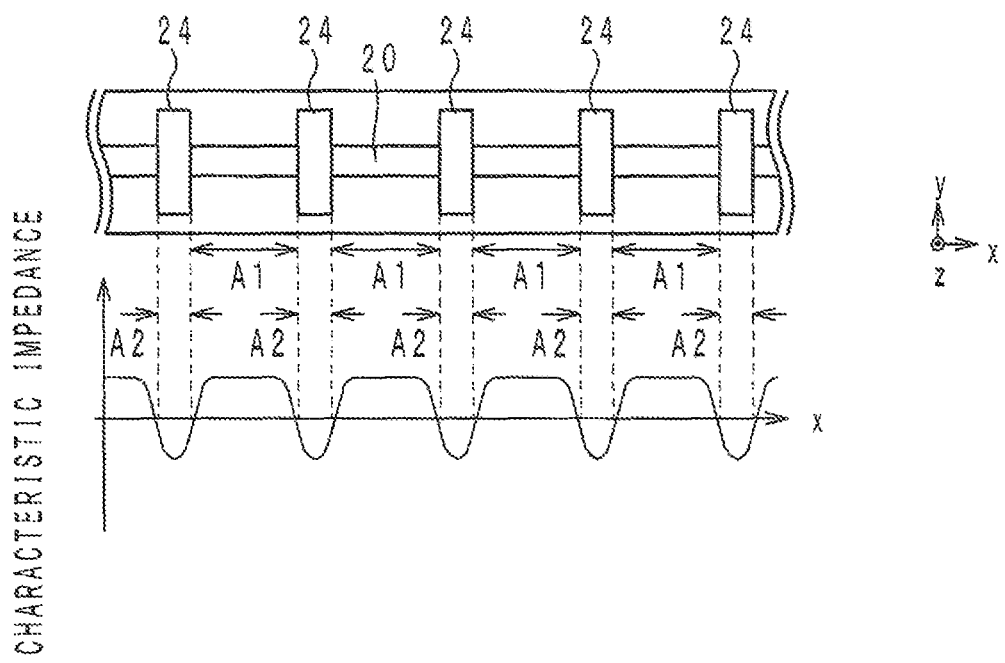
FIG. 8 is a diagram illustrating the relationship of parts of the high-frequency signal line with characteristic impedance.

Furthermore, the high-frequency signal line 10 renders it possible to inhibit spurious radiation also for the reasons given below. FIG. 8 is a diagram illustrating the relationship of portions of the high-frequency signal line 10 with characteristic impedance. More specifically, in the case where the signal line of the high-frequency signal line has a constant characteristic impedance, a standing wave having a relatively long wavelength occurs with nodes at opposite ends of the signal line where the characteristic impedance is high. The standing wave having a relatively long wavelength has a relatively low frequency. When such a relatively low frequency is lower than the frequency of a high-frequency signal to be transmitted through the high-frequency signal line, spurious radiation at the relatively low frequency is emitted from the high-frequency signal line.

Therefore, the high-frequency signal line 10 includes the areas A1 where the ground conductors 24 are not provided and the areas A2 where the ground conductors 24 are provided. As a result, the characteristic impedance of the signal line 20 becomes higher in the areas A1 than in the areas A2, as shown in FIG. 8. In addition, the characteristic impedance of the signal line 20 fluctuates cyclically. Accordingly, the standing wave has nodes in the areas A1 where the characteristic impedance rises. As a result, the standing wave that can occur in the signal line 20 has a wavelength twice the distance between adjacent areas A1. Correspondingly, the standing wave that can occur in the signal line 20 has a relatively high frequency. Therefore, by sufficiently shortening the interval between the areas A1 of the signal line 20, the frequency of the standing wave that can occur in the signal line 20 is rendered higher than the frequency of a high-frequency signal to be transmitted through the high-frequency signal line 10. Thus, when a high-frequency signal is transmitted through the high-frequency signal line 10, spurious radiation is inhibited from being emitted from the high-frequency signal line 10. Note that to more effectively inhibit spurious radiation from the high-frequency signal line 10, the interval between the areas A1 of the signal line 20 (i.e., the interval between the ground conductors 24) is preferably shorter than the wavelength of a high-frequency signal to be transmitted through the high-frequency signal line 10.

Furthermore, in the areas A2, the signal line 20 is opposed to the ground conductors 24, so that capacitances are created therebetween. Accordingly, the characteristic impedance of the signal line 20 is lower in the areas A2 than in the areas A1. However, to prevent the characteristic impedance of the signal line 20 from being excessively low in the areas A2, the width Wb of the signal line 20 in the areas A2 is designed to be less than the width Wa of the signal line 20 in the areas A1. Thus, a high-frequency signal is inhibited from being reflected at the boundaries between the areas A1 and A2.

First Modification

Figure 9:
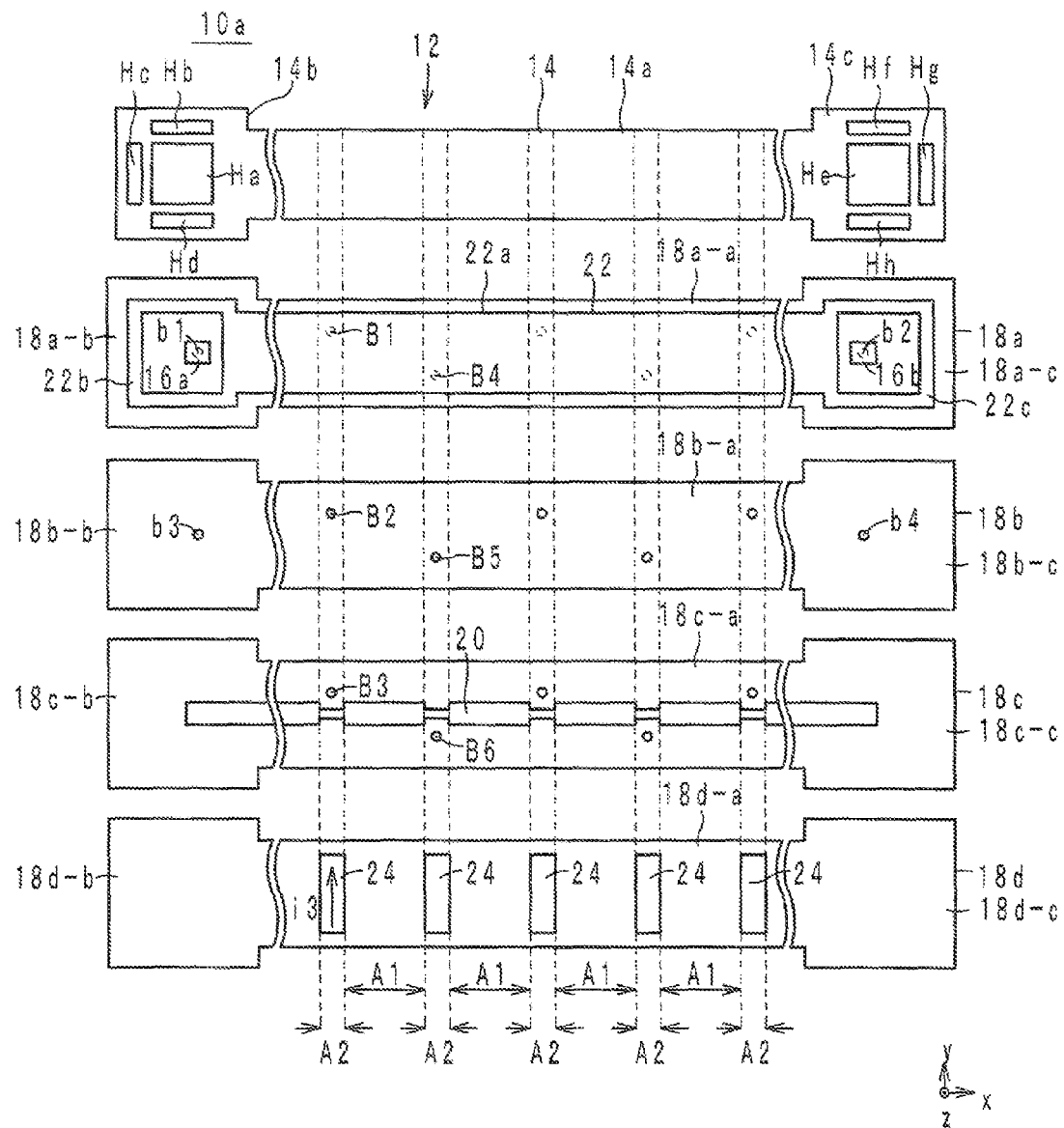
FIG. 9 is an exploded view of a dielectric element assembly of a high-frequency signal line according to a first modification of a preferred embodiment of the present invention.

The configuration of a high-frequency signal line according to a first modification of a preferred embodiment of the present invention will be described below with reference to the drawings. FIG. 9 is an exploded view of a dielectric element assembly 12 of the high-frequency signal line 10a according to the first modification.

The high-frequency signal line 10a differs from the high-frequency signal line 10 in terms of the arrangement of the via-hole conductors B1 to B6. More specifically, in the case of the high-frequency signal line 10, all ground conductors 24 are connected to the ground conductor 22 by the via-hole conductors B1 to B6. On the other hand, in the case of the high-frequency signal line 10a, the ground conductors 24 that are connected to the ground conductor 22 by the via-hole conductors B1 to B3 alternate in the x-axis direction with the ground conductors 24 that are connected to the ground conductor 22 by the via-hole conductors B4 to B6.

The high-frequency signal line 10a thus configured, as with the high-frequency signal line 10, can be readily bent in use. Moreover, the high-frequency signal line 10a, as with the high-frequency signal line 10, inhibits the characteristic impedance of the signal line 20 from deviating from a predetermined characteristic impedance value. In addition, the high-frequency signal line 10a, as with the high-frequency signal line 10, inhibits the occurrence of spurious radiation.

Figure 10A:
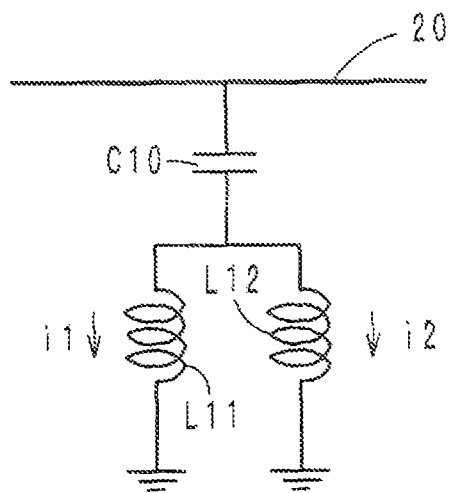
FIG. 10A is an equivalent circuit diagram of a ground conductor of the high-frequency signal line in FIG. 1.
Figure 10B:
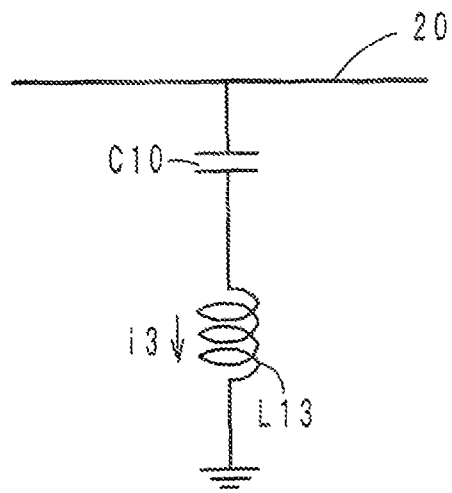
FIG. 10B is an equivalent circuit diagram of a ground conductor of the high-frequency signal line in FIG. 9.

Furthermore, for the reasons given below, the high-frequency signal line 10a renders it possible to achieve reduction in thickness or high-frequency loss. FIG. 10A is an equivalent circuit diagram of the ground conductor 24 of the high-frequency signal line 10, and FIG. 10B is an equivalent circuit diagram of the ground conductor 24 of the high-frequency signal line 10a.

In the case of the high-frequency signal line 10, when a high-frequency signal flows through the signal line 20, currents i1 and i2 flow through the ground conductors 24 by action of electromagnetic induction, as shown in FIG. 2. The currents i1 and i2 flow in opposite directions from the center of the ground conductors 24 in the y-axis direction. Here, the ground conductors 24 of the high-frequency signal line 10 have the circuit structure shown in FIG. 10A. More specifically, the half of each ground conductor 24 that is located on the positive side in the y-axis direction defines an inductance component L11, and the half of each ground conductor 24 that is located on the negative side in the y-axis direction defines an inductance component L12. Moreover, a capacitance component C10 is created between the signal line 20 and the ground conductor 24. When the current i1 flows through the inductance component L11, and the current i2 flows through the inductance component L12, as shown in FIG. 2, the magnetic fields generated by the inductance components L11 and L12 cancel out each other since the currents i1 and i2 are oriented in opposite directions. As a result, the inductance components L11 and L12, as in the equivalent circuit diagram shown in FIG. 10A, are deemed to be not present. Accordingly, in the areas A2, the capacitance components C10 are dominant, so that the characteristic impedance of the signal line 20 becomes lower than a predetermined characteristic impedance value. Therefore, the distance between the signal line 20 and the ground conductor 24 is increased, or the signal line 20 is narrowed, in order to allow the characteristic impedance of the signal line 20 to approximate to the predetermined characteristic impedance value.

On the other hand, in the case of the high-frequency signal line 10a, the ground conductors 24 are connected to either the via-hole conductors B1 to B3 or the via-hole conductors B4 to B6. Therefore, only a current i3, which flows toward either the positive or negative side in the y-axis direction, occurs in the ground conductors 24, as shown in FIG. 9. Here, the ground conductors 24 of the high-frequency signal line 10a have the circuit structure shown in FIG. 10B. More specifically, ground conductors 24 define inductance components L13. In addition, capacitance components C10 are created between the signal line 20 and the ground conductors 24. Accordingly, when the current i3 flows through the inductance components L13, the magnetic fields generated by the inductance components L13 do not cancel out one another. As a result, the inductance components L13, as in the equivalent circuit diagram shown in FIG. 10B, are not deemed to be not present. Accordingly, in the areas A2, the inductance components L13 are dominant, so that the characteristic impedance of the signal line 20 becomes higher than a predetermined characteristic impedance value. Therefore, the distance between the signal line 20 and the ground conductor 24 is decreased, or the signal line 20 is widened, in order to allow the characteristic impedance of the signal line 20 to approximate to the predetermined characteristic impedance value. Thus, the high-frequency signal line 10a renders it possible to achieve reduction in thickness or high-frequency loss.

Second Modification

Figure 11:
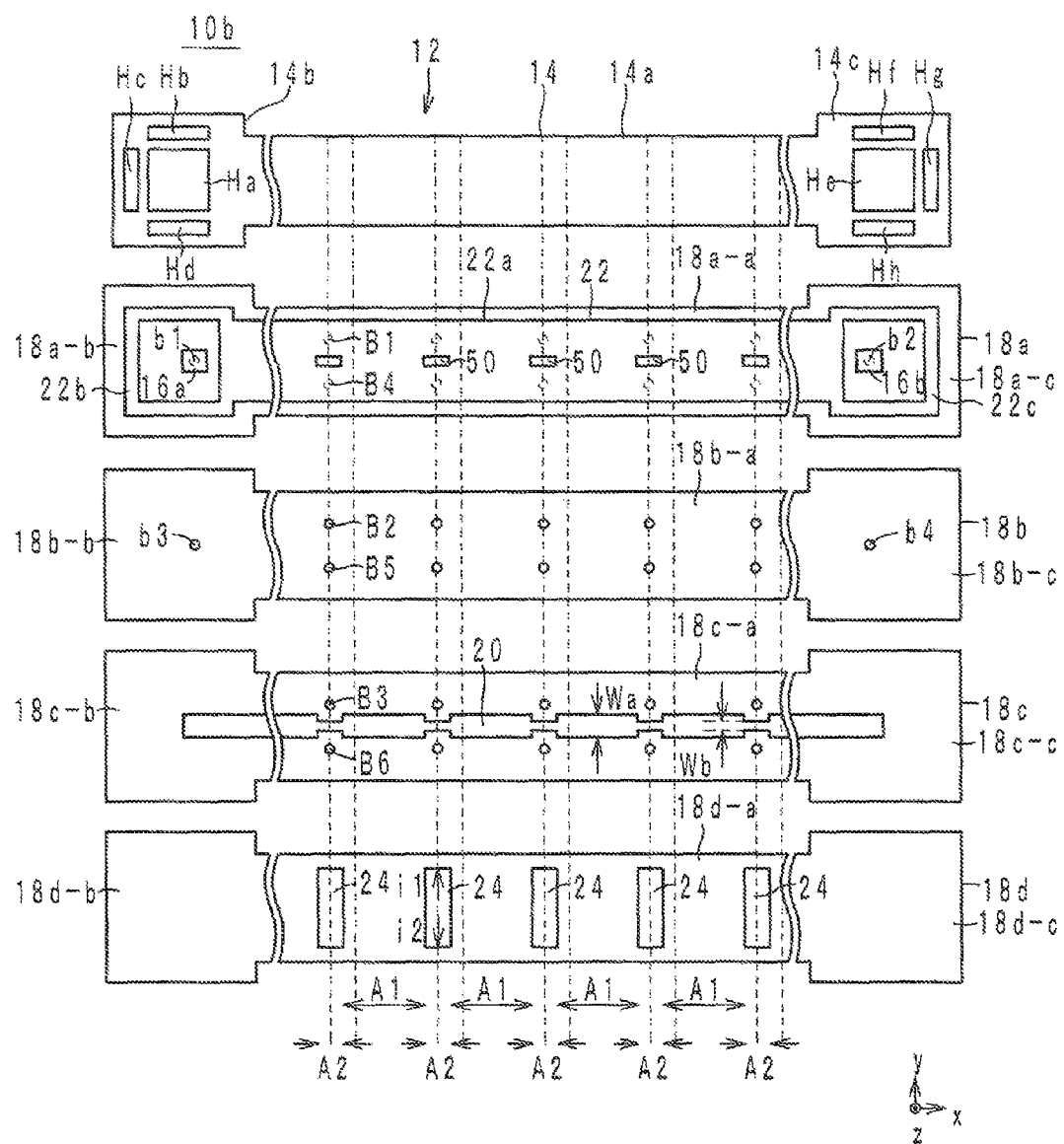
FIG. 11 is an exploded view of a dielectric element assembly of a high-frequency signal line according to a second modification of a preferred embodiment of the present invention.

The configuration of a high-frequency signal line according to a second modification of a preferred embodiment of the present invention will be described below with reference to the drawings. FIG. 11 is an exploded view of a dielectric element assembly 12 of the high-frequency signal line 10b according to the second modification.

The high-frequency signal line 10b differs from the high-frequency signal line 10 in that openings 50 are provided in the ground conductor 22. More specifically, the openings 50 provided in the ground conductor 22 are rectangular or substantially rectangular and arranged at equal intervals in the x-axis direction. The openings 50, when viewed in a plan view in the z-axis direction, overlap with the signal line 20 in the areas A2.

In the case of the high-frequency signal line 10, the signal line 20 is opposed to both of the ground conductors 22 and 24 in the areas A2, so that the characteristic impedance of the signal line 20 is lower in the areas A2 than in the areas A1. Therefore, the high-frequency signal line 10b includes the openings 50 provided in the ground conductor 22 so as to inhibit the characteristic impedance of the signal line 20 from being excessively lower in the areas A2 than in the areas A1. Thus, the characteristic impedance of the signal line 20 is inhibited from changing abruptly at the boundaries between the areas A1 and A2.

Note that in the high-frequency signal line 10b, as in the high-frequency signal line 10a, the ground conductors 24 that are connected to the ground conductor 22 by the via-hole conductors B1 to B3 may alternate in the x-axis direction with the ground conductors 24 that are connected to the ground conductor 22 by the via-hole conductors B4 to B6.

Third Modification

Figure 12:
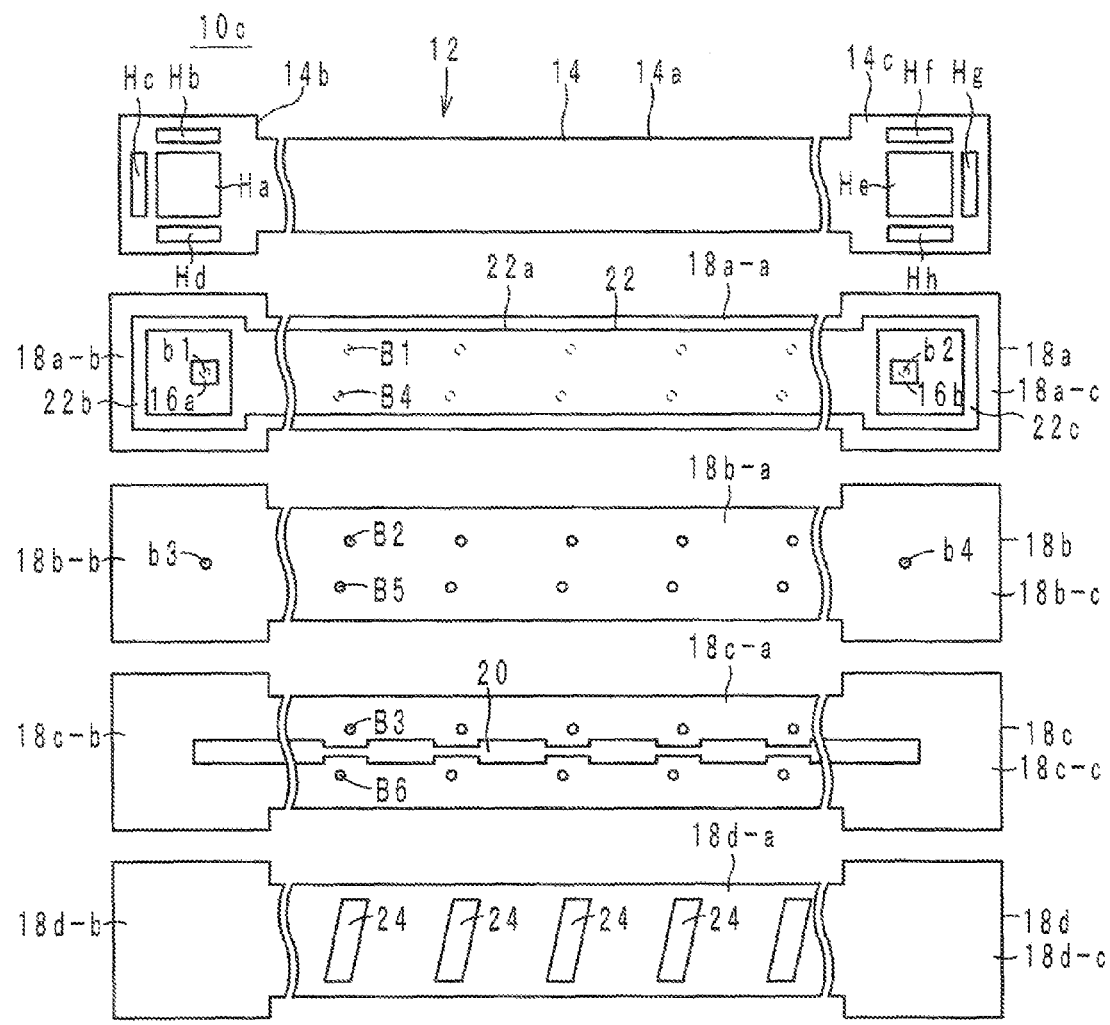
FIG. 12 is an exploded view of a dielectric element assembly of a high-frequency signal line according to a third modification of a preferred embodiment of the present invention.

The configuration of a high-frequency signal line according to a third modification of a preferred embodiment of the present invention will be described below with reference to the drawings. FIG. 12 is an exploded view of a dielectric element assembly 12 of the high-frequency signal line 10c according to the third modification.

The high-frequency signal line 10c differs from the high-frequency signal line 10 in that the ground conductors 24 are oblique relative to the y-axis direction. More specifically, the ground conductors 24 are inclined with respect to the y-axis direction toward the positive side in the x-axis direction at their ends on the positive side in the y-axis direction. As a result, the distance between the signal line 20 and the ground conductor 24 in each area A2 decreases gradually toward the center of the area A2 in the x-axis direction. Accordingly, in the area A2, the value of the capacitance created between the signal line 20 and the ground conductor 24 varies gently. Thus, the characteristic impedance of the signal line 20 is inhibited from changing abruptly.

Note that in the high-frequency signal line 10c, as in the high-frequency signal line 10a, the ground conductors 24 that are connected to the ground conductor 22 by the via-hole conductors B1 to B3 may alternate in the x-axis direction with the ground conductors 24 that are connected to the ground conductor 22 by the via-hole conductors B4 to B6.

Fourth Modification

Figure 13:
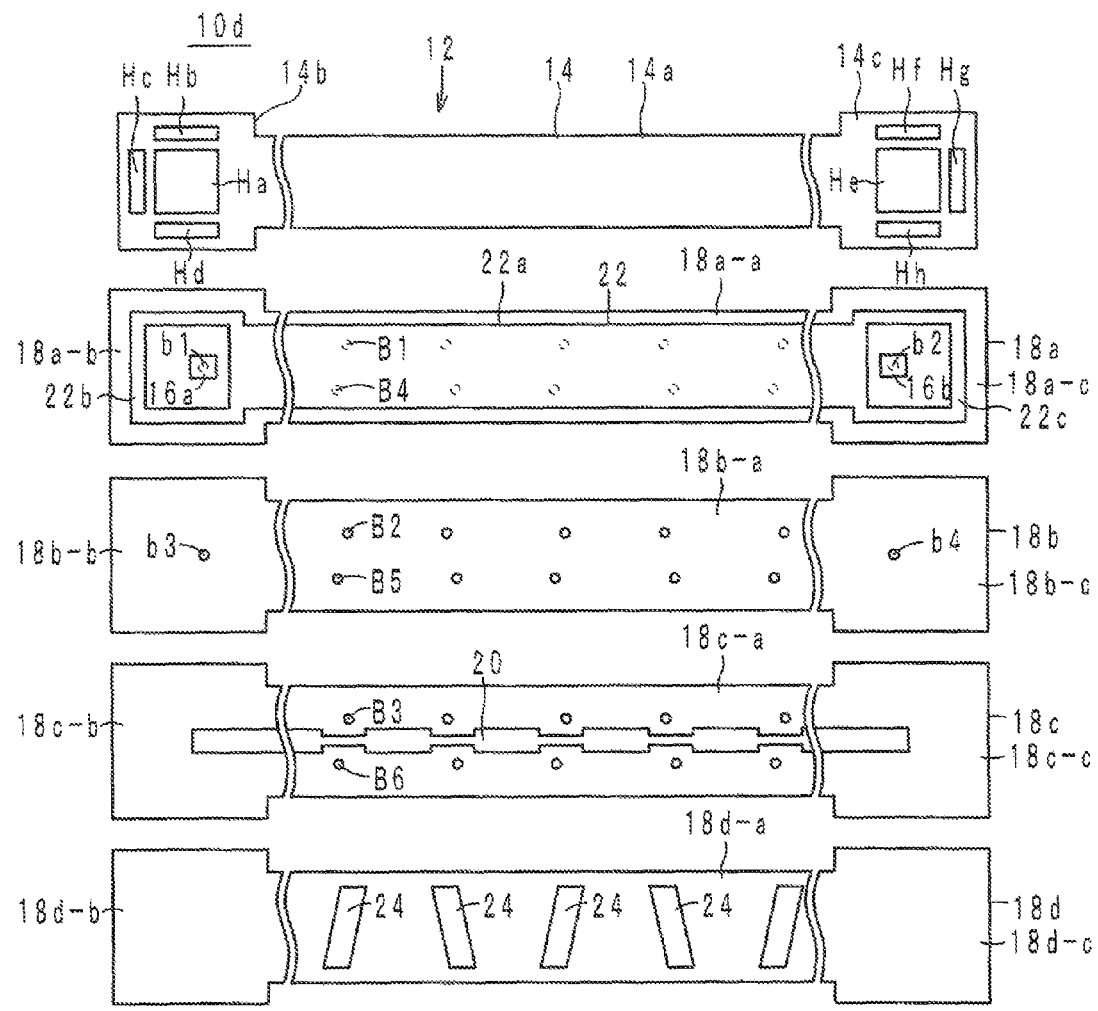
FIG. 13 is an exploded view of a dielectric element assembly of a high-frequency signal line according to a fourth modification of a preferred embodiment of the present invention.
Figure 13:

The configuration of a high-frequency signal line according to a fourth modification of a preferred embodiment of the present invention will be described below with reference to the drawings. FIG. 13 is an exploded view of a dielectric element assembly 12 of the high-frequency signal line 10d according to the fourth modification.

The high-frequency signal line 10d differs from the high-frequency signal line 10c in terms of the directions in which the ground conductors 24 are inclined. More specifically, in the high-frequency signal line 10d, the ground conductors 24 that are inclined with respect to the y-axis direction toward the positive side in the x-axis direction at their ends on the positive side in the y-axis direction alternate with the ground conductors 24 that are inclined with respect to the y-axis direction toward the positive side in the x-axis direction at their ends on the negative side in the y-axis direction.

Note that in the high-frequency signal line 10d, as in the high-frequency signal line 10a, the ground conductors 24 that are connected to the ground conductor 22 by the via-hole conductors B1 to B3 may alternate in the x-axis direction with the ground conductors 24 that are connected to the ground conductor 22 by the via-hole conductors B4 to B6.

Furthermore, the ground conductors 24 that are inclined with respect to the y-axis direction toward the positive side in the x-axis direction at their ends on the positive side in the y-axis direction do not have to alternate with the ground conductors 24 that are inclined with respect to the y-axis direction toward the positive side in the x-axis direction at their ends on the negative side in the y-axis direction. However, given the balance of ground potentials, the alternating arrangement in the high-frequency signal line 10d is preferable.

Fifth Modification

Figure 14:
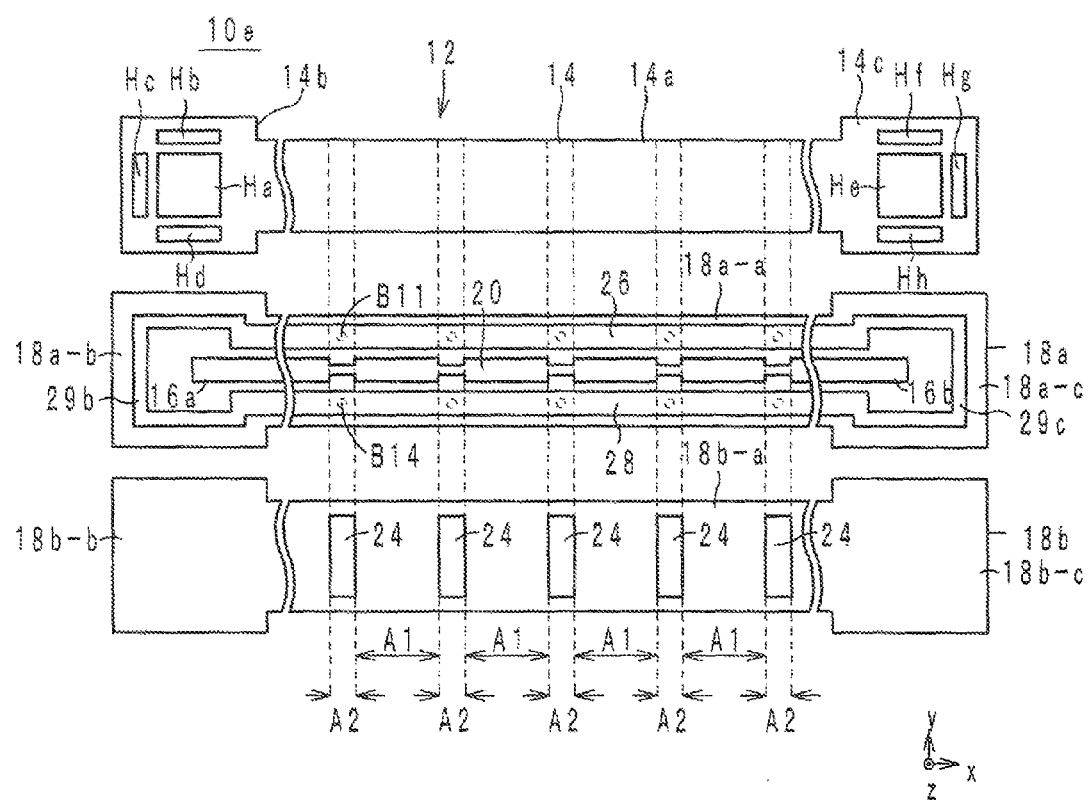
FIG. 14 is an exploded view of a dielectric element assembly of a high-frequency signal line according to a fifth modification of a preferred embodiment of the present invention.

The configuration of a high-frequency signal line according to a fifth modification of a preferred embodiment of the present invention will be described below with reference to the drawings. FIG. 14 is an exploded view of a dielectric element assembly 12 of the high-frequency signal line 10e according to the fifth modification.

The high-frequency signal line 10e differs from the high-frequency signal line 10 in that ground conductors 26 and are provided in place of the ground conductor 22. More specifically, in addition to the ground conductors 26 and 28, the high-frequency signal line 10e further includes terminal portions 29b and 29c and via-hole conductors B11 and B14.

The ground conductors 26 and 28 are provided on the top surface of the dielectric sheet 18a in the dielectric element assembly 12, so as to extend along the signal line 20 in the x-axis direction. The ground conductor 26, when viewed in a plan view in the z-axis direction, is positioned on the positive side in the y-axis direction (i.e., one side in a direction perpendicular or substantially perpendicular to the direction in which the signal line 20 extends). The ground conductor 28, when viewed in a plan view in the z-axis direction, is positioned on the negative side in the y-axis direction (i.e., the opposite side in the direction perpendicular or substantially perpendicular to the direction in which the signal line 20 extends). Accordingly, the signal line 20 and the ground conductors 26 and 28 define a coplanar structure.

The via-hole conductors B11 extend through the line portion 18a-a of the dielectric sheet 18a in the z-axis direction, so as to be aligned at equal intervals in the line portion 18a-a. The via-hole conductors B11, when viewed in a plan view in the z-axis direction, are positioned on the positive side in the y-axis direction relative to the signal line 20. The via-hole conductors B11 connect the ground conductor 26 to the ends of the ground conductors 24 that are located on the positive side in the y-axis direction.

The via-hole conductors B14 extend through the line portion 18a-a of the dielectric sheet 18a in the z-axis direction, so as to be aligned at equal intervals in the line portion 18a-a. The via-hole conductors B14, when viewed in a plan view in the z-axis direction, are positioned on the negative side in the y-axis direction relative to the signal line 20. The via-hole conductors B14 connect the ground conductor 28 to the ends of the ground conductors 24 that are located on the negative side in the y-axis direction.

Furthermore, the terminal portion 29b is connected to the ends of the ground conductors 26 and 28 on the negative side in the x-axis direction, and has the same structure as the terminal portion 22b in FIG. 2. The terminal portion 29c is connected to the ends of the ground conductors 26 and 28 on the positive side in the x-axis direction, and has the same structure as the terminal portion 22c in FIG. 2.

The high-frequency signal line 10e thus configured, as with the high-frequency signal line 10, can be readily bent in use. Moreover, the high-frequency signal line 10e, as with the high-frequency signal line 10, inhibits the characteristic impedance of the signal line 20 from deviating from a predetermined characteristic impedance value. In addition, the high-frequency signal line 10e, as with the high-frequency signal line 10, inhibits the occurrence of spurious radiation.

Furthermore, also for the reasons given below, the high-frequency signal line 10e can be readily bent in use. Specifically, when the high-frequency signal line is bent, tensile stress or compressive stress is applied to ground conductors, which are positioned away from the signal line in the z-axis direction. As a result, the high-frequency signal line is inhibited from being bent.

Therefore, in the case of the high-frequency signal line 10e, no ground conductors that can inhibit the high-frequency signal line 10e from being bent are provided on the positive side in the z-axis direction relative to the signal line 20. Instead, the ground conductors 26 and 28 are provided on the dielectric sheet 18a on which the signal line 20 is provided. Since the ground conductors 26 and 28 are provided on the dielectric sheet 18a on which the signal line 20 is provided, neither large tensile stress nor large compressive stress is applied to the ground conductors 26 and 28. Accordingly, the ground conductors 26 and 28 do not significantly inhibit the high-frequency signal line 10e from being bent. Thus, the high-frequency signal line 10e can be readily bent in use.

Sixth Modification

Figure 15:
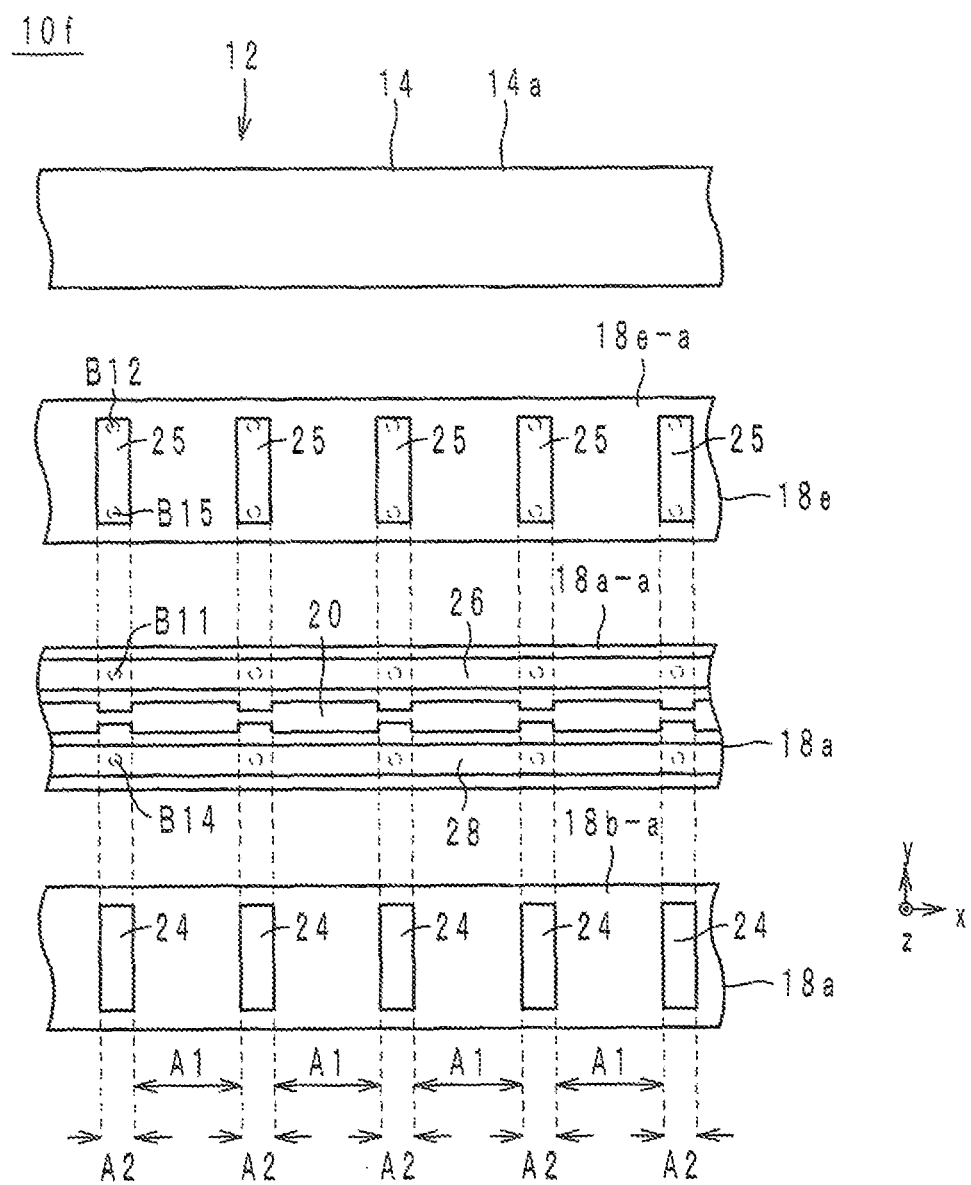
FIG. 15 is an exploded view of a dielectric element assembly of a high-frequency signal line according to a sixth modification of a preferred embodiment of the present invention.

The configuration of a high-frequency signal line according to a sixth modification of a preferred embodiment of the present invention will be described below with reference to the drawings. FIG. 15 is an exploded view of a dielectric element assembly 12 of the high-frequency signal line 10f according to the sixth modification.

The high-frequency signal line 10f differs from the high-frequency signal line 10e in that ground conductors 25 are further provided. More specifically, in addition to the ground conductors 25, the high-frequency signal line 10f further includes a dielectric sheet 18e and via-hole conductors B12 and B15.

The dielectric sheet 18e is laminated on the top surface of the dielectric sheet 18a. The ground conductors 25 have the same shape as the ground conductors 24, and the ground conductors 25, when viewed in a plan view in the z-axis direction, entirely overlap with the ground conductors 24.

The via-hole conductors B12 extend through a line portion 18e-a of the dielectric sheet 18e in the z-axis direction, so as to be aligned at equal intervals in the line portion 18e-a. The via-hole conductors B12, when viewed in a plan view in the z-axis direction, are positioned on the positive side in the y-axis direction relative to the signal line 20. The via-hole conductors B12 connect the ground conductor 26 to the ends of the ground conductors 25 that are located on the positive side in the y-axis direction.

The via-hole conductors B15 extend through the line portion 18e-a of the dielectric sheet 18e in the z-axis direction, so as to be aligned at regular intervals in the line portion 18e-a. The via-hole conductors B15, when viewed in a plan view in the z-axis direction, are positioned on the negative side in the y-axis direction relative to the signal line 20. The via-hole conductors B15 connect the ground conductor 28 to the ends of the ground conductors 25 that are located on the negative side in the y-axis direction.

The high-frequency signal line 10f thus configured, as with the high-frequency signal line 10, can be readily bent in use. Moreover, the high-frequency signal line 10f, as with the high-frequency signal line 10, inhibits the characteristic impedance of the signal line 20 from deviating from a predetermined characteristic impedance value. In addition, the high-frequency signal line 10f, as with the high-frequency signal line 10, inhibits occurrence of spurious radiation.

Seventh Modification

Figure 16:
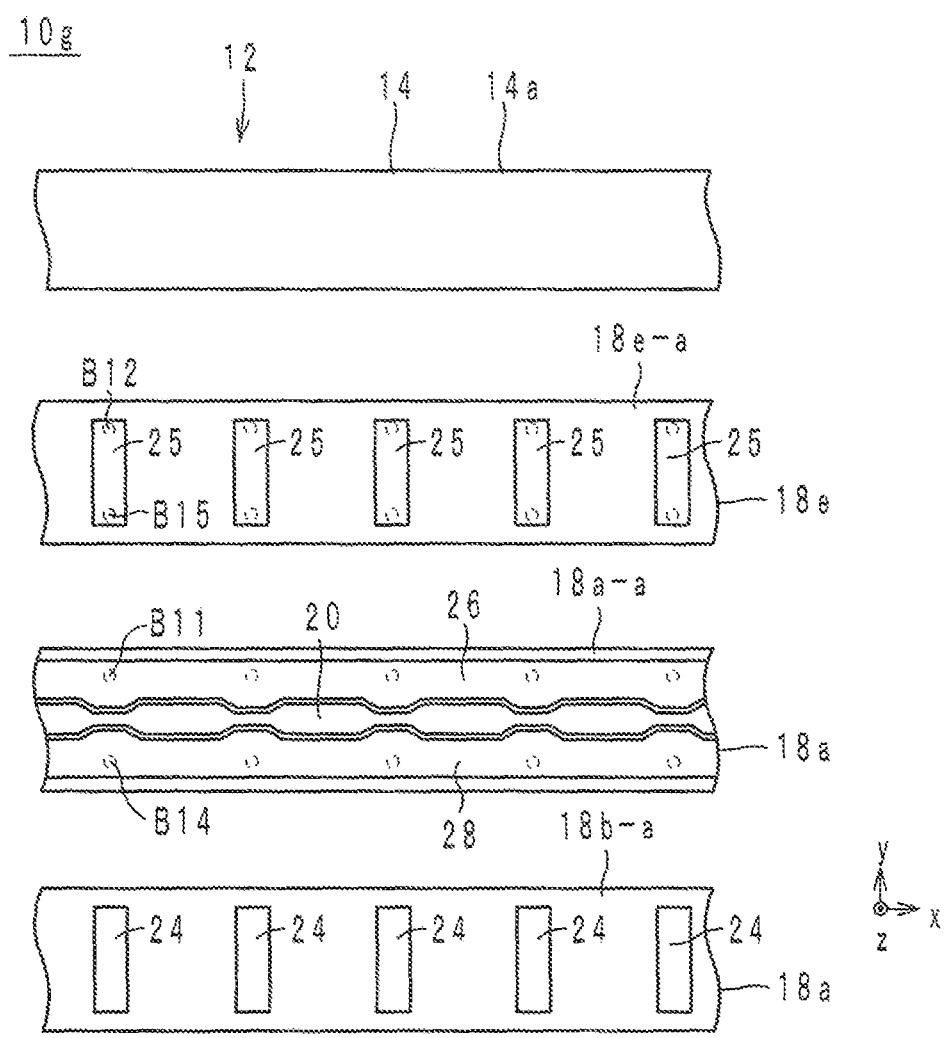
FIG. 16 is an exploded view of a dielectric element assembly of a high-frequency signal line according to a seventh modification of a preferred embodiment of the present invention.
Figure 17:
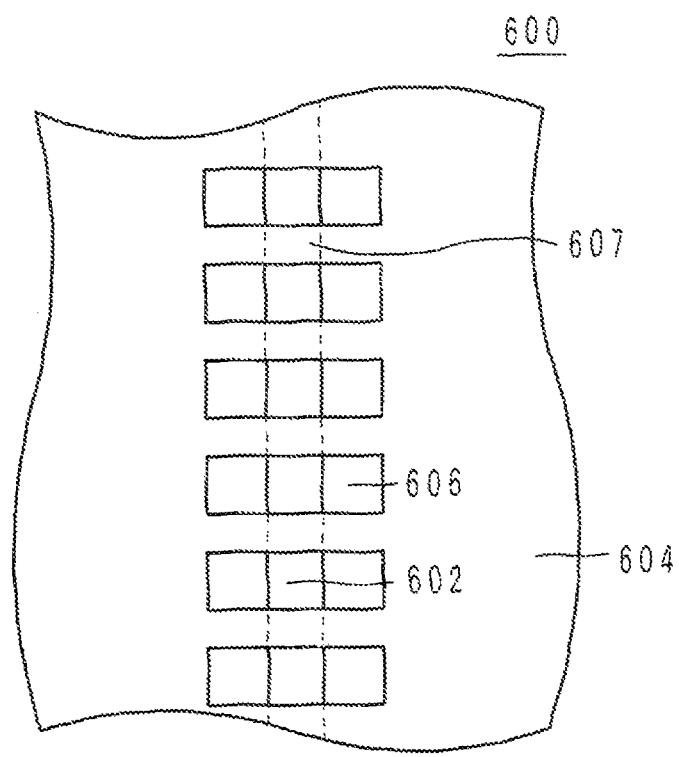
FIG. 17 illustrates a flexible board disclosed in Japanese Patent Laid-Open Publication No. 2007-123740, as viewed in a plan view in the direction of lamination.

The configuration of a high-frequency signal line according to a seventh modification of a preferred embodiment of the present invention will be described below with reference to the drawings. FIG. 16 is an exploded view of a dielectric element assembly 12 of the high-frequency signal line 10g according to the seventh modification.

The signal line 20 of the high-frequency signal line 10g tapers at opposite ends of each area A1 in the x-axis direction. Accordingly, the width of the signal line 20 changes gradually. In addition, there is a uniform gap provided between the signal line 20 and the ground conductor 26. Therefore, the ground conductor 26 has a shape conforming to the shape of the signal line 20 where it is opposed to the signal line 20.

In the high-frequency signal line 10g thus configured, the width of the signal line 20 changes gradually, and therefore, the characteristic impedance of the signal line 20 changes gradually as well. Moreover, the gap formed between the signal line 20 and the ground conductor 26 is uniform, and therefore, the value of the capacitance created between the signal line 20 and the ground conductor 26 is inhibited from varying from one part to another of the signal line 20. Thus, the characteristic impedance of the signal line 20 is inhibited from fluctuating.

Other Preferred Embodiments

The present invention is not limited to the high-frequency signal lines 10 and 10a to 10g according to the above preferred embodiments, and variations can be made within the spirit and scope of the present invention.

Note that the configurations of the high-frequency signal lines 10 and 10a to 10g may be used in combination.

Furthermore, the high-frequency signal lines 10 and 10a to 10g may be used on RF circuit boards such as antenna front end modules.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal line comprising:
an element assembly including a plurality of flexible insulator layers;
a linear signal line provided in or on the element assembly;
a first ground conductor provided in or on the element assembly and extending along the signal line;
a plurality of second ground conductors provided in or on the element assembly and arranged at predetermined intervals in a direction in which the signal line extends, on a first side in a direction of lamination relative to the signal line, the second ground conductors being opposite to the signal line with at least one of the insulator layers positioned therebetween; and
a plurality of first via-hole conductors extending through at least one of the insulator layers so as to connect the first and second ground conductors; wherein
the second ground conductors are not connected to one another in one of the plurality of flexible insulator layers of the element assembly that includes the second ground conductors.

2. The high-frequency signal line according to claim 1, wherein the high-frequency signal line further includes:
a third ground conductor provided in or on the element assembly and extending along the signal line; and
a plurality of second via-hole conductors extending through at least one of the insulator layers so as to connect the second and third ground conductors; wherein
the first via-hole conductors, when viewed in the plan view in the direction of lamination, are provided on one side in a direction perpendicular or substantially perpendicular to the direction in which the signal line extends, relative to the signal line;
the second via-hole conductors, when viewed in the plan view in the direction of lamination, are provided on the other side in the perpendicular or substantially perpendicular direction;
the first ground conductor, when viewed in the plan view in the direction of lamination, is provided on one of the sides in the perpendicular or substantially perpendicular direction; and
the third ground conductor, when viewed in the plan view in the direction of lamination, is provided on the other side in the perpendicular or substantially perpendicular direction.

3. The high-frequency signal line according to claim 1, wherein the signal line is wider in areas where the signal line does not overlap with the second ground conductors than in areas where the signal line overlaps with the second ground conductors.

4. The high-frequency signal line according to claim 1, wherein the second ground conductors are arranged at equal intervals.

5. The high-frequency signal line according to claim 1, wherein the second ground conductors are spaced at intervals of a half or less of a wavelength of a high-frequency signal to be transmitted through the signal line.

6. The high-frequency signal line according to claim 1, wherein the first ground conductor is positioned on a second side in the direction of lamination relative to the signal line, so as to be opposite to the signal line with at least one of the insulator layers positioned therebetween.

7. The high-frequency signal line according to claim 6, wherein
the high-frequency signal line further includes a plurality of second via-hole conductors extending through at least one of the insulator layers so as to connect the first and second ground conductors;
the first via-hole conductors, when viewed in a plan view in the direction of lamination, are provided on one side in a direction perpendicular or substantially perpendicular to the direction in which the signal line extends, relative to the signal line; and
the second via-hole conductors, when viewed in the plan view in the direction of lamination, are provided on the other side in the perpendicular or substantially perpendicular direction.

8. The high-frequency signal line according to claim 7, wherein the second ground conductors are connected to the first ground conductor by the first and second via-hole conductors.

9. An electronic device comprising:
a housing; and
a high-frequency signal line accommodated in the housing; wherein
the high-frequency signal line includes:
an element assembly including a plurality of flexible insulator layers;
a linear signal line provided in or on the element assembly;
a first ground conductor provided in or on the element assembly and extending along the signal line;
a plurality of second ground conductors provided in or on the element assembly and arranged at predetermined intervals in a direction in which the signal line extends, on a first side in a direction of lamination relative to the signal line, the second ground conductors being opposite to the signal line with at least one of the insulator layers positioned therebetween; and
a plurality of first via-hole conductors extending through at least one of the insulator layers so as to connect the first and second ground conductors; wherein the second ground conductors are not connected to one another in one of the plurality of flexible insulator layers of the element assembly that includes the second ground conductors.

10. The electronic device according to claim 9, wherein the high-frequency signal line further includes:
a third ground conductor provided in or on the element assembly and extending along the signal line; and
a plurality of second via-hole conductors extending through at least one of the insulator layers so as to connect the second and third ground conductors; wherein
the first via-hole conductors, when viewed in the plan view in the direction of lamination, are provided on one side in a direction perpendicular or substantially perpendicular to the direction in which the signal line extends, relative to the signal line;
the second via-hole conductors, when viewed in the plan view in the direction of lamination, are provided on the other side in the perpendicular or substantially perpendicular direction;
the first ground conductor, when viewed in the plan view in the direction of lamination, is provided on one of the sides in the perpendicular or substantially perpendicular direction; and
the third ground conductor, when viewed in the plan view in the direction of lamination, is provided on the other side in the perpendicular or substantially perpendicular direction.

11. The electronic device according to claim 9, wherein the signal line is wider in areas where the signal line does not overlap with the second ground conductors than in areas where the signal line overlaps with the second ground conductors.

12. The electronic device according to claim 9, wherein the second ground conductors are arranged at equal intervals.

13. The electronic device according to claim 9, wherein the second ground conductors are spaced at intervals of a half or less of a wavelength of a high-frequency signal to be transmitted through the signal line.

14. The electronic device according to claim 9, wherein the first ground conductor is positioned on a second side in the direction of lamination relative to the signal line, so as to be opposite to the signal line with at least one of the insulator layers positioned therebetween.

15. The electronic device according to claim 14, wherein
the high-frequency signal line further includes a plurality of second via-hole conductors extending through at least one of the insulator layers so as to connect the first and second ground conductors;
the first via-hole conductors, when viewed in a plan view in the direction of lamination, are provided on one side in a direction perpendicular or substantially perpendicular to the direction in which the signal line extends, relative to the signal line; and
the second via-hole conductors, when viewed in the plan view in the direction of lamination, are provided on the other side in the perpendicular or substantially perpendicular direction.

16. The electronic device according to claim 15, wherein the second ground conductors are connected to the first ground conductor by the first and second via-hole conductors.

* * * * *